United States Patent
Martin et al.

(10) Patent No.: US 11,112,702 B2
(45) Date of Patent: Sep. 7, 2021

(54) DEVICE AND METHOD FOR CHARACTERIZING A MICROLITHOGRAPHIC MASK

(71) Applicant: Carl Zeiss SMT GmbH, Oberkochen (DE)

(72) Inventors: Sven Martin, Jena (DE); Thomas Frank, Jena (DE); Ulrich Matejka, Jena (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 17/007,751

(22) Filed: Aug. 31, 2020

(65) Prior Publication Data

US 2021/0063892 A1     Mar. 4, 2021

(30) Foreign Application Priority Data

Sep. 4, 2019 (DE) .............................. 102019123741

(51) Int. Cl.
*G03F 7/20* (2006.01)

(52) U.S. Cl.
CPC ........ *G03F 7/70566* (2013.01); *G03F 7/7085* (2013.01)

(58) Field of Classification Search
CPC .... G03F 7/70133; G03F 1/84; G03F 7/70258; G03F 7/7085; G03F 7/706; G03F 7/70566; G03F 7/70941; G03F 7/70591; G03F 7/7065; G03F 7/70633; G03F 7/702; G03F 7/70058; G03F 7/70191; G03F 7/70116; G03F 7/705; G03F 7/70141; G03F 7/70466; G03F 7/70625; G03F 7/70516;

(Continued)

(56) References Cited

U.S. PATENT DOCUMENTS

| 2006/0007541 A1 | 1/2006 | Totzeck et al. |
| 2006/0012873 A1 | 1/2006 | Totzeck et al. |

(Continued)

FOREIGN PATENT DOCUMENTS

| DE | 102004033602 | 2/2006 |
| DE | 102004033603 | 2/2006 |

(Continued)

OTHER PUBLICATIONS

Gardner, Dennis F., et al.: "High numerical aperture reflection mode coherent diffraction microscopy using off-axis apertured illumination", *Optics Express*, vol. 20, No. 17, pp. 19050-19059 (Aug. 13, 2012).

(Continued)

*Primary Examiner* — Mesfin T Asfaw
(74) *Attorney, Agent, or Firm* — Fish & Richardson P.C.

(57) ABSTRACT

The invention relates to a device and a method for characterizing a microlithographic mask. A device according to the invention has an illumination optical unit for illuminating structures of a mask intended for use in a lithography process in a microlithographic projection exposure apparatus, a detector unit, and an evaluation unit for evaluating the data recorded by the detector unit, wherein the detector unit is configured for the spatially resolved determination of both the intensity and the polarization state of the respectively impinging light emanating from the mask.

20 Claims, 4 Drawing Sheets

(58) Field of Classification Search
 CPC ............ G03F 7/70491; G03F 7/70091; G03F
               9/7003; G03F 7/70083; G01M 11/0264;
               G01J 4/04; G01N 21/9501; G01N 21/23;
               G01N 21/211; G02B 27/28
 See application file for complete search history.

(56) References Cited

U.S. PATENT DOCUMENTS

| 2008/0079939 | A1* | 4/2008 | Fiolka | G03F 7/70133 |
| | | | | 356/364 |
| 2008/0297775 | A1 | 12/2008 | Greif-Wustenbecker et al. | |
| 2019/0011839 | A1 | 1/2019 | Seitz et al. | |
| 2019/0391087 | A1 | 12/2019 | Matejka et al. | |

FOREIGN PATENT DOCUMENTS

| DE | 102005062237 | 7/2007 |
| DE | 102007009661 | 3/2008 |
| DE | 102007045891 | 4/2008 |
| DE | 102011082481 | 12/2012 |
| DE | 102011113940 | 3/2013 |
| DE | 102017115262 | 1/2019 |
| EP | 1 615 062 | 1/2006 |

OTHER PUBLICATIONS

Maiden, Andrew M., et al: "Superresolution imaging via ptychography", *J. Opt. Soc. Am. A*, vol. 28, No. 4, pp. 604-612 (Apr. 2011).

Zhang, Bosheng, et al.: "Full field tabletop EUV coherent diffractive imaging in a transmission geometry", *Optics Express*, vol. 21, No. 19, pp. 21970-21980 (Sep. 23, 2013).

The Office Action for German Application No. DE 10 2019 123 741.6, dated Apr. 2, 2020 (with English Translation).

* cited by examiner

DEVICE AND METHOD FOR CHARACTERIZING A MICROLITHOGRAPHIC MASK

CROSS-REFERENCE TO RELATED APPLICATION

This application claims priority under 35 U.S.C. § 119 from German Patent Application DE 10 2019 123 741.6, filed on Sep. 4, 2019, the content of which is hereby incorporated by reference in its entirety.

TECHNICAL FIELD

The invention relates to a device and a method for characterizing a microlithographic mask. The invention is applicable both to finding defects and in further applications for characterizing the structures on a mask, for instance in position determination or determining the line width of the structures (CD="critical dimension") and ascertaining process windows (e.g. by determining the line width depending on dose and defocus).

BACKGROUND

Microlithography is used for production of microstructured components, such as for example integrated circuits or liquid crystal displays (LCDs). The microlithography process is conducted in what is called a projection exposure apparatus, which comprises an illumination device and a projection lens. The image of a mask (=reticle) illuminated by means of the illumination device is in this case projected by means of the projection lens onto a substrate (e.g. a silicon wafer) coated with a light-sensitive layer (photoresist) and arranged in the image plane of the projection lens, in order to transfer the mask structure to the light-sensitive coating of the substrate.

In the lithography process, undesired defects on the mask have a particularly disadvantageous effect since they can be reproduced with every exposure step. A direct analysis of the imaging effect of possible defect positions is thus desirable in order to minimize the mask defects and in order to realize a successful mask repair. Therefore, there is a need to measure or to qualify the mask rapidly and simply, to be precise as far as possible under the same conditions such as are really present in the projection exposure apparatus.

For this purpose, it is known, in a mask inspection apparatus, to record and evaluate an aerial image of a segment of the mask. For recording the aerial image, in this case the structures to be measured on the mask are illuminated by an illumination optical unit, wherein the light coming from the mask is projected via an imaging optical unit onto a detector unit and detected.

In order to carry out the measurement of the mask if possible under conditions analogous to those in the projection exposure apparatus, in the mask inspection apparatus the mask is typically illuminated in a manner identical to that in the projection exposure apparatus, wherein in particular the same wavelength, the same numerical aperture and also the identical (if appropriate polarized) illumination setting are set in the mask inspection apparatus.

However, in practice a problem results from the fact that in the imaging optical unit of the mask inspection apparatus, the imaging of the mask onto the detector unit—unlike the imaging on the wafer that is carried out in the projection exposure apparatus—does not take place in reduced fashion, but rather in greatly magnified fashion. The thus greatly different numerical aperture present in the respective projection or imaging optical unit (said numerical aperture being almost zero in the imaging optical unit of the mask inspection apparatus) has the consequence that the imaging on the wafer that takes place in the lithography process differs significantly from the imaging onto the detector unit that takes place in the mask inspection apparatus with regard to polarization-dependent effects that occur. In this case, "polarization-dependent effect" should be understood to mean the polarization dependence of the interference of the electromagnetic radiation that takes place in the respective image plane.

In order to take account of the above problem and to determine the polarization-dependent effects that occur in the microlithographic projection exposure apparatus and to take them into account in the aerial image generation, it is known, in particular, to carry out a plurality of individual imagings with the mask inspection apparatus, during which individual imagings different polarization-optical components are positioned and adjusted or moved in the illumination and/or imaging optical unit and the correspondingly generated images are combined with one another and subjected to computation.

The concept described above has the disadvantage, however, that carrying out the plurality of individual imagings and combining the correspondingly generated images and subjecting them to computation is time-consuming, as a result of which the throughput ultimately achieved by the device or mask inspection apparatus is undesirably limited.

Further problems that occur in practice when carrying out the plurality of individual imagings and combining them and subjecting them to computation concern the accuracy ultimately achieved during mask characterization. In particular, measurement inaccuracies can result from the fact that mechanical vibrations and/or thermally induced deformations that occur during the operation of the device vary across the plurality of individual imagings. Further measurement inaccuracies can result from a mechanical movement of the polarization-optical components that is carried out between the individual imagings, and also from unavoidable manufacturing defects of said components (in particular manufacturing-dictated deviations from an ideal plane-parallel geometry).

With respect to the prior art, reference is made merely by way of example to EP 1 615 062 B1, DE 10 2007 045 891 A1, DE 10 2017 115 262 A1, DE 10 2004 033 603 A1, DE 10 2004 033 602 A1, DE 10 2005 062 237 A1 and DE 10 2007 009 661 A1.

SUMMARY

In a general aspect, the present invention provides a device and a method for characterizing a microlithographic mask which enable a faster and simplified measurement taking account of the conditions given in the lithography process including the polarization-dependent effects that occur there.

This aspect is achieved by means of the device and respectively the method in accordance with the features of the independent claims.

In another general aspect, a device according to the invention for characterizing a microlithographic mask has:
 an illumination optical unit for illuminating structures of
  a mask intended for use in a lithography process in a
  microlithographic projection exposure apparatus, a detector unit, and an evaluation unit for evaluating the data recorded by the detector unit, wherein the detector unit is configured for the spatially resolved determination of both the intensity and the polarization state of the respectively impinging light emanating from the mask.

The invention is based on the concept, in particular, during mask inspection, of determining the polarization-dependent effects that occur in the later lithography process in the microlithographic projection exposure apparatus with a significantly reduced measurement complexity and in a comparatively short time by virtue of the fact that a detector unit which is not only intensity-sensitive but also polarization-sensitive is used for recording data used for mask characterization and in particular for emulating polarization-dependent effects.

The invention thus differs inter alia from the conventional approaches described in the introduction by the fact that instead of the progressive recording of a plurality of successive camera images with different polarizer settings, a single exposure step is carried out for the polarized illumination setting which in each case is set in the illumination optical unit and is predefined during the operation of the microlithographic projection exposure apparatus, and the corresponding detector or camera image is correspondingly captured in a pixel-resolved manner.

It should be pointed out that according to the invention, as a result of the use of a polarization-sensitive detector unit, as additionally described below, disadvantages of a loss of light and also of an ultimately reduced spatial resolution are deliberately accepted. These disadvantages are accepted, however, in order in return to achieve firstly a significant increase in the speed of the mask characterization process and thus in the throughput achieved by the device.

Furthermore, by comparison with carrying out a plurality of progressive exposure steps with mutually different polarizer settings in the imaging optical unit, the recording of a detector or camera image that is effected in each case in a single exposure step according to the invention has advantages with regard to the accuracy ultimately achieved during the mask characterization. This holds true, firstly, since, by avoiding temporally successive exposure steps that are combined with one another during the evaluation, the problem of a temporal variation of the influence of mechanical vibrations and/or thermal loads and attendant thermally induced deformations is avoided as well. Secondly, dispensing with the use of mechanically movable polarization-optical components in the manner according to the invention implies an increased accuracy in so far as measurement inaccuracies owing to this mechanical movement of the components and also the manufacturing defects present therein are avoided. Moreover, the shorter measurement time allows averaging over a plurality of recordings, as a result of which the disadvantage of the loss of light is at least partly compensated for again.

In accordance with a further aspect, the invention also relates to a device for characterizing an object, comprising an illumination optical unit for illuminating the object with light having an operating wavelength in a range between 13 nm and 250 nm, in particular between 190 nm and 200 nm;

a detector unit; and an evaluation unit for evaluating the data recorded by the detector unit;

wherein the detector unit is configured for the spatially resolved determination of both the intensity and the polarization state of the respectively impinging light emanating from the object.

In this respect, the invention is thus not restricted to the characterization of a microlithographic mask, but rather in principle is also usable for characterizing any other objects which are measurable in a polarization-resolved manner. Merely by way of example, mention shall be made here of microlithographically produced structures (e.g. resist structures or conductor tracks on a wafer), LCD displays or else workpieces under mechanical stress (e.g. workpieces composed of glass that are to be measured with regard to their stress birefringence).

In accordance with one embodiment, the detector unit has a sensor arrangement composed of a plurality of intensity sensors and a polarizer arrangement composed of a plurality of polarizers, said polarizer arrangement being situated in the optical path upstream of the sensor arrangement, wherein polarizers of the polarizer arrangement are respectively assigned to different intensity sensors of the sensor arrangement.

In accordance with one embodiment, the sensor arrangement is configured as a periodic array of intensity sensors.

In accordance with one embodiment, the polarizer arrangement is configured as a periodic array of polarizers.

In accordance with one embodiment, the polarizer arrangement has polarizers having mutually different polarization transmission directions. In this case, in particular, the polarization transmission directions of different polarizers can differ from one another by an integer multiple of 22.5°, in particular by an integer multiple of 45°, or by an integer multiple of 30°, in particular by an integer multiple of 60°.

In accordance with one embodiment, the sensor arrangement also has intensity sensors on which, during the operation of the device, light impinges without previously passing through one of the polarizers of the polarizer arrangement.

In accordance with one embodiment, there are arranged upstream of a portion of the sensor pixels polarizers and additionally retardation elements (e.g. lambda/4 plates), preferably in the optical path upstream of the polarizers.

In accordance with one embodiment, the polarizer arrangement is designed for an operating wavelength of less than 250 nm, in particular for an operating wavelength of less than 200 nm.

In accordance with one embodiment, the device is designed for emulating a polarization-dependent effect in the form of a polarization dependence of the interference of electromagnetic radiation that takes place in the wafer plane during the operation of the microlithographic projection exposure apparatus, wherein for a respective polarized illumination setting which is set in the illumination optical unit and which, both in terms of the intensity distribution and in terms of the polarization distribution, at least approximately corresponds to the illumination setting predefined in the microlithographic projection exposure apparatus, the data used for emulating the polarization-dependent effects are recorded by the detector unit in a single exposure step.

In accordance with one embodiment, the device has an imaging optical unit for imaging the mask or the object, respectively, onto the detector unit. However, the invention is not restricted to the presence of such an imaging optical unit. In further embodiments, an image can also be generated with the application of the CDI method (CDI="coherent diffractive imaging") by reconstructing the image with the application of an iterative Fourier retrieval algorithm (wherein, in this case, the diffraction spectrum of the mask is determined by way of the detector unit or camera). Details of the iterative Fourier retrieval algorithm are described in U.S. published patent application 2019/0391087 A1, herein incorporated by reference.

In accordance with one embodiment, the evaluation unit is therefore configured to reconstruct an image of the mask or of the object, respectively, with the application of an iterative Fourier retrieval algorithm.

In connection with the CDI method, reference is made to U.S. published patent application 2019/0391087 A1 as well as to the publications by D. F. Gardner et al.: "High numerical aperture reflection mode coherent diffraction microscopy using off-axis apertured illumination," Optics Express, Vol. 20, No. 17, 2012, A. Maiden et al: "Super-resolution imaging via ptychography," J. Opt. Soc. Am. A, Vol. 28, No. 4, 2011 and B. Zhang et al.: "Full field tabletop EUV coherent diffractive imaging in a transmission geometry," Optics Express, Vol. 21, No. 19, 2013.

The invention furthermore also relates to a method for characterizing a microlithographic mask,
wherein structures of a mask intended for use in a lithography process in a microlithographic projection exposure apparatus are illuminated by an illumination optical unit;
wherein a spatially resolved determination of both the intensity and the polarization state of the respectively impinging light emanating from the mask is carried out by at least one detector unit.

In accordance with one embodiment, the detector unit has a sensor arrangement composed of a plurality of intensity sensors and a polarizer arrangement composed of a plurality of polarizers, said polarizer arrangement being situated in the optical path upstream of the sensor arrangement, wherein polarizers of the polarizer arrangement are respectively assigned to different intensity sensors of the sensor arrangement.

In accordance with one embodiment, the respective extinction factor of the polarizers is taken into account during the evaluation of the data recorded by the detector unit.

In accordance with one embodiment, for a respective polarized illumination setting which is set in the illumination optical unit and which, both in terms of the intensity distribution and in terms of the polarization distribution, at least approximately corresponds to the illumination setting predefined in the microlithographic projection exposure apparatus, the data used for emulating the polarization-dependent effects are recorded by the detector unit in a single exposure step.

In accordance with one embodiment, data recorded by a detector unit are evaluated in an evaluation unit, wherein polarization-dependent effects in the form of a polarization dependence of the interference of electromagnetic radiation that takes place in the wafer plane during the operation of the microlithographic projection exposure apparatus are emulated during this evaluation.

In accordance with one embodiment, the mask is imaged onto the at least one detector unit by an imaging optical unit.

In accordance with one embodiment, an image of the mask is reconstructed with the application of an iterative Fourier retrieval algorithm.

With regard to further advantages and preferred configurations of the method, reference is made to the above explanations in association with the device according to the invention.

Further configurations of the invention can be gathered from the description and the dependent claims.

The invention is explained in greater detail below on the basis of exemplary embodiments illustrated in the accompanying figures.

DETAILED DESCRIPTION

Figure 3:
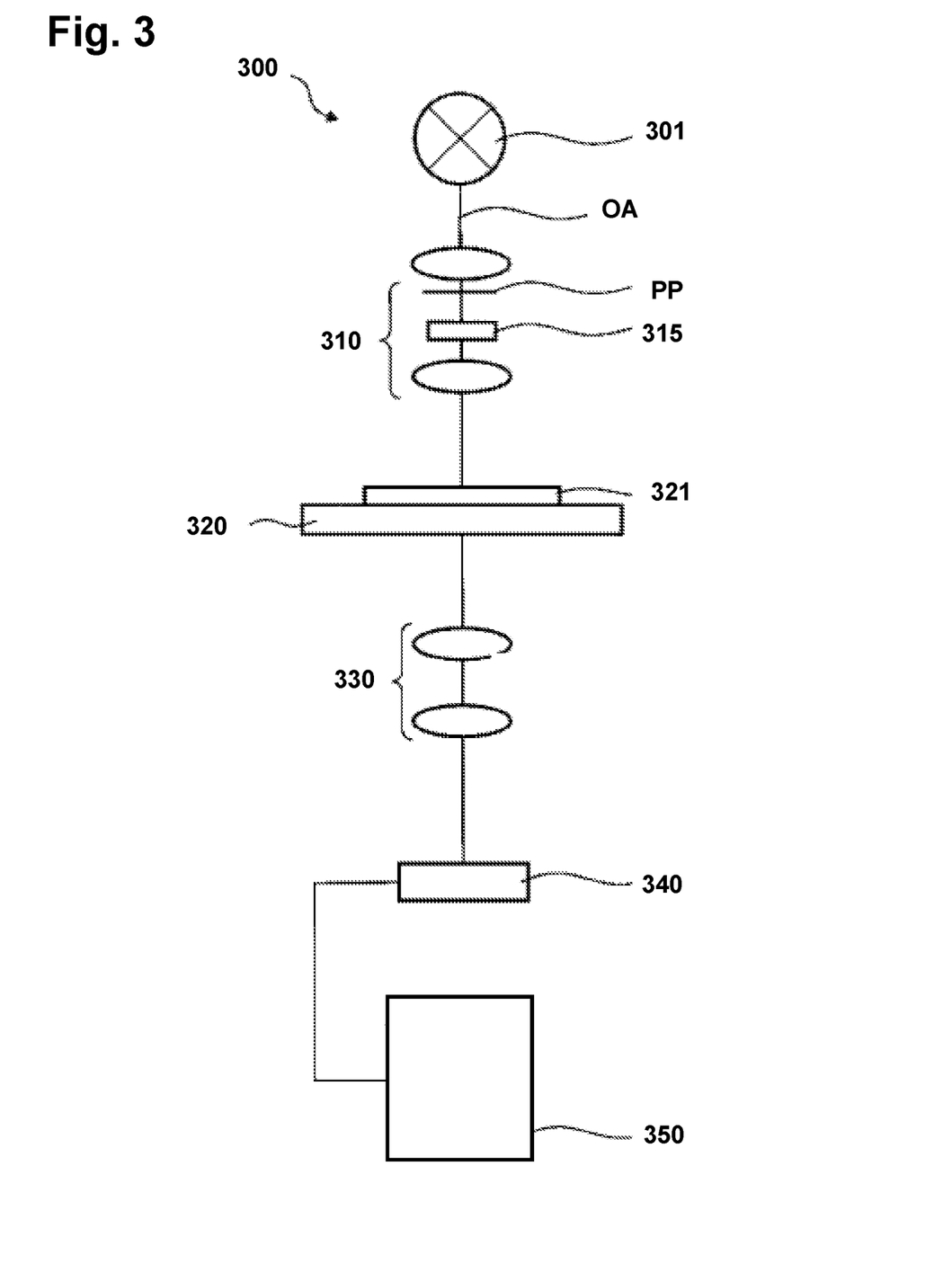
FIG. 3 shows a schematic illustration for elucidating one exemplary construction of a mask inspection apparatus.

FIG. 3 shows one possible construction of a mask inspection apparatus 300 in which the present invention can be realized.

In accordance with FIG. 3, in a mask inspection apparatus 300, a mask 321 is mounted on a mask holder 320. The structures to be measured on the mask 321 are illuminated with illumination light generated by a light source 301 via an illumination optical unit 310. Light coming from the mask 321 is imaged by an imaging optical unit 330 onto a detector unit 340 and detected. The image data recorded by the detector unit 340 are evaluated in an evaluation unit 350 for determining the position of the structures.

Figure 4A:
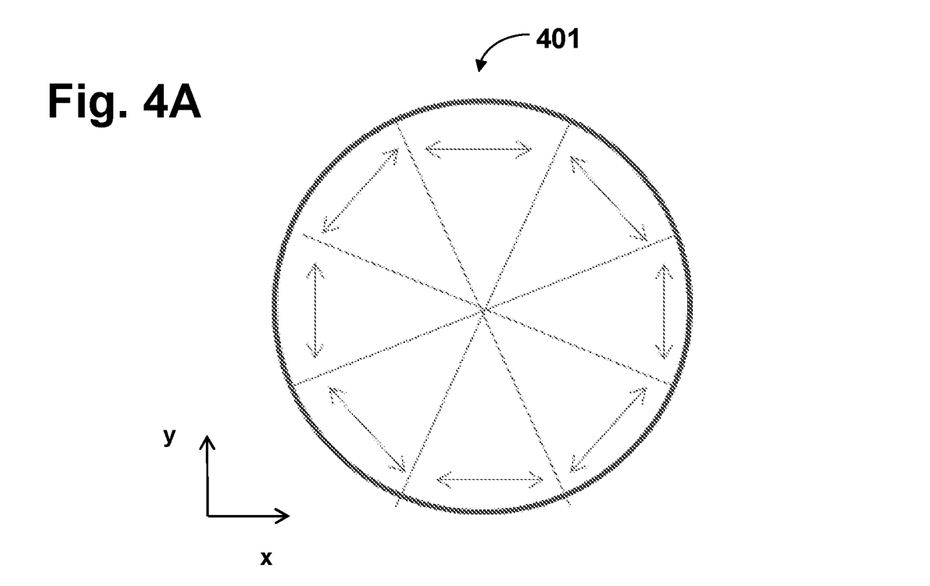
FIGS. 4A and 4B show schematic illustrations of exemplary polarized illumination settings set in the context of the present invention.
Figure 4B:
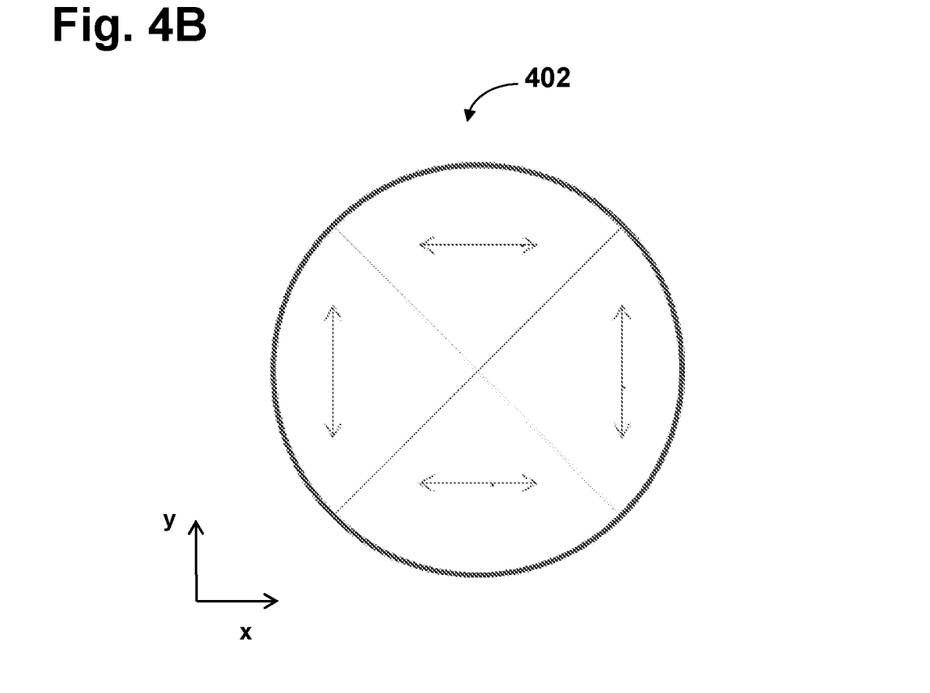

By way of a pupil filter present in a pupil plane PP in the illumination optical unit 310, and by way of a polarizer 315, in the illumination optical unit 310 it is possible to set an illumination setting which, both in terms of the intensity distribution and in terms of the polarization distribution, corresponds to the illumination setting predefined in the microlithographic projection exposure apparatus. In this case, the polarized illumination setting predefined for the lithography process can be, merely by way of example, a quasi-tangential illumination setting in accordance with FIG. 4A or a quadrupole setting with x-y-polarization in accordance with FIG. 4B.

What the embodiments of the invention described below have in common is that the detector unit (corresponds to the detector unit 340 in FIG. 3) is configured for the spatially resolved determination of both the intensity and the polarization state of the respectively impinging light. The invention makes use of this configuration by virtue of the fact that for a respective polarized illumination setting which is set in the illumination optical unit 310 and which, both in terms of the intensity distribution and in terms of the polarization distribution, at least approximately corresponds to the illumination setting predefined in the microlithographic projection exposure apparatus, the image data used for emulating the polarization-dependent effect can be recorded in a single exposure step.

Figure 1A:
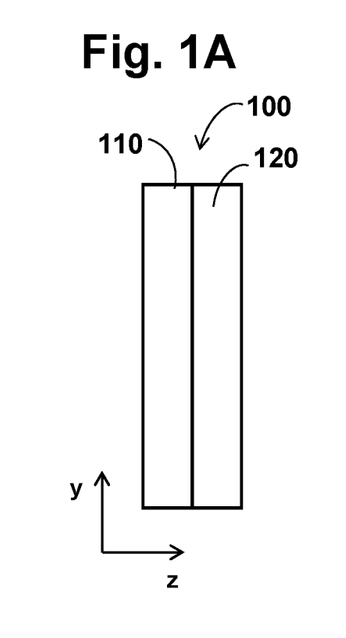
FIGS. 1A, 1B, 1C and 2 show schematic illustrations for elucidating various embodiments of a device according to the invention.
Figure 1B:
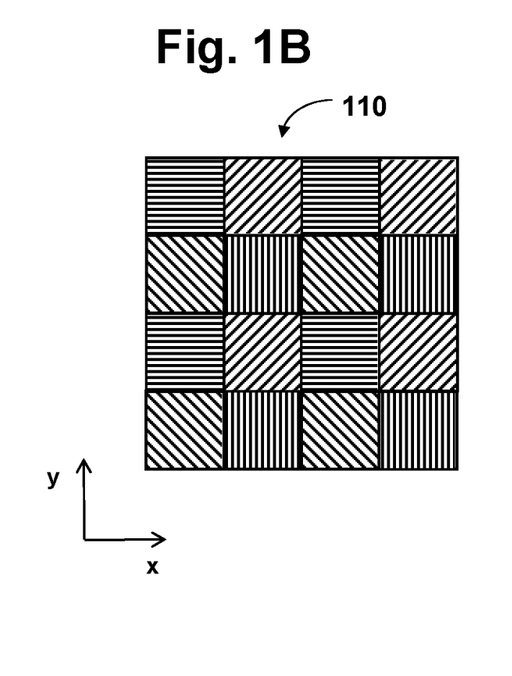
Figure 1C:
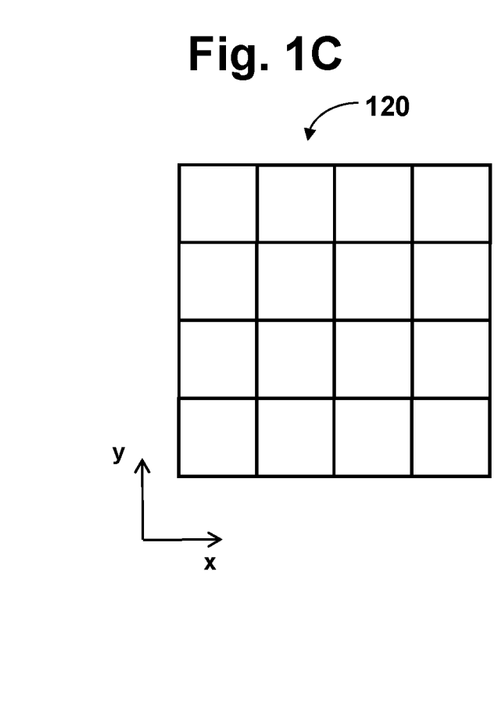

FIGS. 1A-1C show schematic illustrations for elucidating the possible construction of a detector unit according to the invention or of the components present therein in side view (FIG. 1A) and respectively in plan view (FIGS. 1B and 1C).

Accordingly, in addition to a sensor arrangement 120 configured as a periodic array of intensity sensors in accordance with FIG. 1C, the detector unit 100 has a polarizer arrangement 110 situated in the optical path upstream of said sensor arrangement 120. In the exemplary embodiment in accordance with FIG. 1B, said polarizer arrangement 110 is likewise configured as a periodic array and has a plurality of polarizers having different polarization transmission directions. Said polarizers can be configured (without the invention being restricted thereto) in particular as grating polarizers (typically produced lithographically). The polarization transmission direction is perpendicular to the direction of the grating. The horizontal lines in the upper left cell of FIG. 1B represent the direction of the grating, so that the cell allows light having vertical polarization (i.e. polarization along y-direction) to pass. The polarizer arrangement 110 can have a substrate made from a material transparent to the operating wavelength of the light source 301. Alternatively, the structure can be deposited onto the substrate in one or several layers and can be made of any other material, for example a metal (e.g. Hafnium) or metal oxide (e.g. Hafnium oxide). In this case, the grating constant or the width of the structures of the grating polarizers is chosen suitably to be of the order of magnitude of the respective operating wavelength of the device. The grating constant refers to periodicity of the grating structures. For example, if the wavelength of the light source 301 is $\lambda$, the grating constant of the grating polarizer can be in a range from $\lambda/4$ to $\lambda$. Given an exemplary operating wavelength of the device of approximately 193 nm, said grating constant of the grating polarizers can be, in particular, in the range of (0.05-0.2)µm. As an alternative to the use of such grating polarizers, it is also possible to use other types of polarizers (e.g. thin-film polarizers).

As indicated schematically in FIG. 1B, the polarization transmission directions of different polarizers can differ from one another in particular in the exemplary embodiment by an integer multiple of 22.5°, more particularly by an integer multiple of 45°. In the specific exemplary embodiment, said polarization transmission directions are at an angle of 0°, 45°, 90° and respectively 135° relative to the x-axis in the coordinate system depicted. This configuration has the consequence that for a cluster or "superpixel" formed in each case from four polarizers having different polarization transmission directions, in combination with the respectively associated intensity sensors of the intensity sensor arrangement 120 the complete information about the degree and direction of polarization of the impinging light is obtained. As likewise evident, however, the resolution ultimately achieved is reduced by a factor of two on account of the above grouping or combination of four individual pixels to form a single cluster or "superpixel."

Only every fourth (camera) pixel of the detector unit is available for each of the four directions of polarization. By way of an interpolation (e.g. a linear or cubic interpolation or a spline interpolation), it is possible to obtain the complete information regarding intensity, degree of polarization and direction of polarization for each camera pixel.

Furthermore, the use according to the invention of the individual polarizers of the polarizer arrangement 120 results in a loss of light and a loss of resolution.

According to the invention, however, the abovementioned disadvantages of losses of resolution and light are deliberately accepted in order in return to achieve an increase in both the throughput achieved by the device and the accuracy achieved. In this regard, for a polarized illumination setting (e.g. a quasi-tangential illumination setting in accordance with FIG. 4A or a quadrupole illumination setting with x-y-polarization in accordance with FIG. 4B) set in each case in the illumination optical unit 310, a detector or camera image can be recorded in a single exposure step, without this necessitating carrying out a plurality of exposure steps with different settings of a polarizer in the imaging optical unit.

The invention is not restricted to the specific configuration of the polarizer arrangement 110 in accordance with FIG. 1B. In particular, the number of polarizers assigned to an individual cluster or "superpixel" as above can vary depending on the specific application. Furthermore, the number of polarizers present in each case within a cluster or "superpixel" per polarization transmission direction can also be different.

FIG. 1B shows an example polarizer arrangement 110 that a 4×4 array of cells (each cell including a grating polarizer having a specified polarization transmission direction), and FIG. 1C shows an example sensor arrangement 120 that a 4×4 array of cells (each cell including an intensity sensor). The polarizer arrangement 110 and the sensor arrangement 120 can also have other configurations, such as having a larger array of cells so that the resolution of the image captured by the mask inspection apparatus 300 can be greater. In some implementations, the operating wavelength of the mask inspection apparatus 300 can be in a range from 13 nm to 250 nm, or from 190 nm to 200 nm. Having an operating wavelength in a range from 13 nm to 250 nm, in particular from 190 nm to 200 nm has the advantage that higher resolutions can be achieved.

Figure 2:
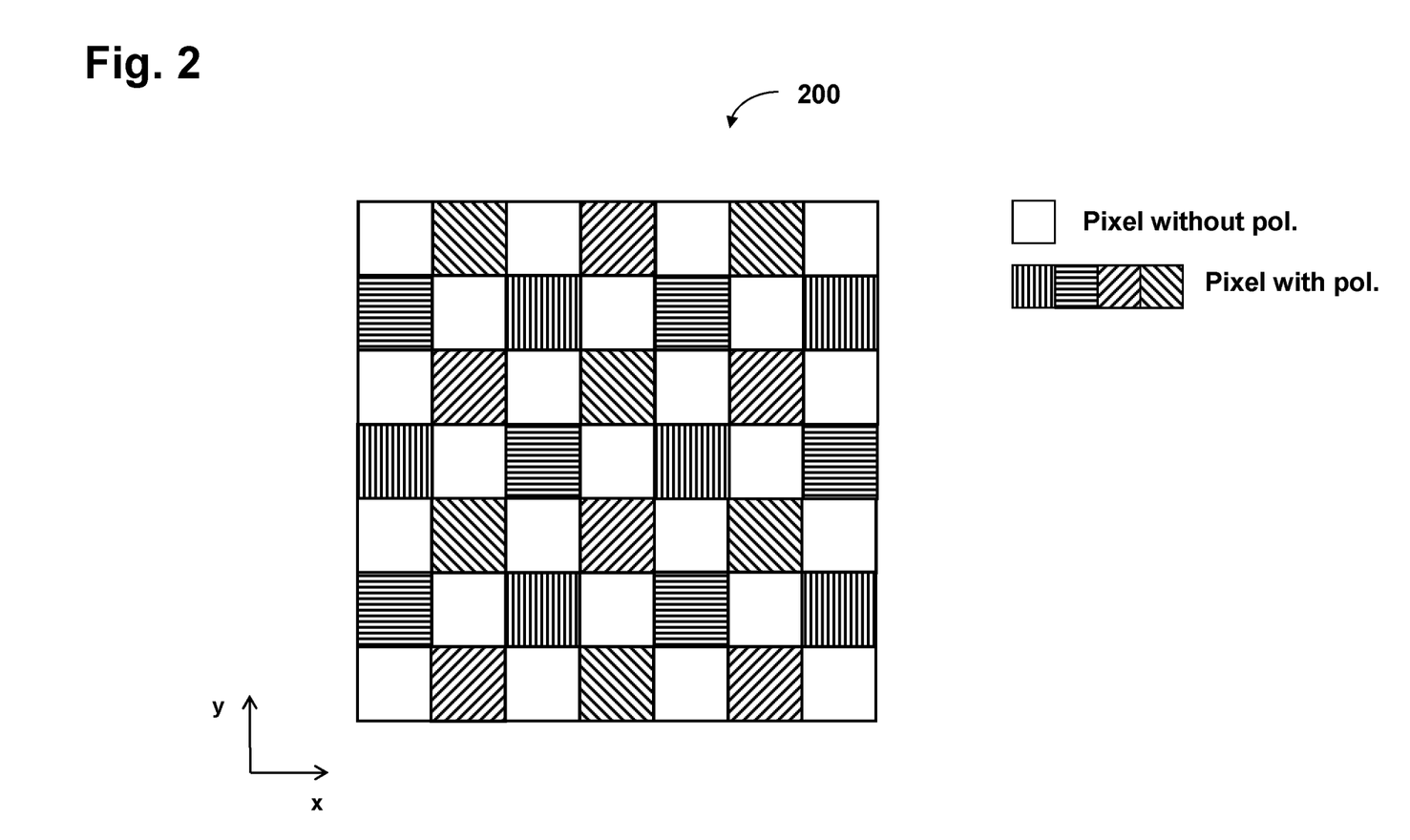

Furthermore, it is also possible (as it were by virtue of corresponding "gaps" within the polarizer arrangement 110), during the operation of the device, for intensity sensors within the sensor arrangement 120 to be impinged on by light which has not previously passed through one of the polarizers of the polarizer arrangement 110. One corresponding embodiment is illustrated schematically in FIG. 2. This configuration (which has 2*8 pixels within a respective cluster or "superpixel," of which pixels four are without polarization information or without a polarizer present within the polarizer arrangement and the remaining four pixels are "distributed" among the four different polarization transmission directions described above with reference to FIG. 1B) has in comparison with FIG. 1B the advantage of an increased intensity resolution and increased intensity sensitivity in conjunction with reduced resolution with regard to the polarization information. Depending on the application, it is also possible to choose other suitable configurations in which the polarization resolution or the intensity resolution is increased.

Preferably, the respective extinction factor of the (e.g. grating) polarizers is taken into account during the evaluation of the image data recorded by the detector unit 100 or 200. For example, the image data recorded by the detector unit 100 or 200 is processed taking into account the respective extinction factor of the polarizers.

In the case of the concept according to the invention, therefore, it does not prove to be disadvantageous that, e.g. grating polarizers have a non-ideal degree of polarization (corresponding to an extinction factor of less than 100% for the respectively unwanted direction of polarization), since this can be taken into account accordingly during the evaluation of the image data, as will be shown in an example described in the following:

I_max=transmission factor of the polarizer for the wanted polarization,

I_min=transmission factor of the polarizer for the unwanted polarization, extinction_factor=(Imax−Imin)/(Imax+Imin).

In the best case the extinction_factor is 100%. For real polarizers the extinction factor will be <100%.

One superpixel consists, in the present example, of 4 pixels with polarization direction 0°, 45°, 90° and 135° each.

I1=measured intensity of the 1st pixel,
I2=measured intensity of the 2nd pixel,
I3=measured intensity of the 3rd pixel,
I4=measured intensity of the 4th pixel,
Imean=(I1+I2+I3+I4)/4,
I1_corrected=Imean+(I1−Imean)/extinction_factor,
I2_corrected=Imean+(I2−Imean)/extinction_factor,
I3_corrected=Imean+(I3−Imean)/extinction_factor,
I4_corrected=Imean+(I4−Imean)/extinction_factor.

If the polarization is calculated from these corrected intensities I1_corrected, I2_corrected, I3_corrected and I4_corrected, the result is the same one would get using ideal polarizers with 100% extinction_factor.

In some implementations, the evaluation unit 350 (FIG. 3) can include one or more data processors for processing data, one or more storage devices for storing data, such as one or more databases, and/or one or more computer programs including instructions that when executed by the evaluation unit causes the evaluation unit to carry out the processes. The evaluation unit can include one or more input devices, such as a keyboard, a mouse, a touchpad, and/or a voice command input module, and one or more output devices, such as a display, and/or an audio speaker. The evaluation unit can show graphical user interfaces on the display to assist the user of the mask inspection apparatus 300.

In some implementations, the evaluation unit can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the evaluation unit is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for characterizing a mask for microlithography described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

Even though the invention has been described on the basis of specific embodiments, numerous variations and alternative embodiments will be apparent to the person skilled in the art, for example through combination and/or exchange of features of individual embodiments. In the example of FIGS. 1B and 1C, each grating polarizer corresponds to one intensity sensor. In some implementations, each grating polarizer can correspond to two or more intensity sensors. Accordingly, it goes without saying for the person skilled in the art that such variations and alternative embodiments are also encompassed by the present invention, and the scope of the invention is restricted only within the meaning of the appended patent claims and the equivalents thereof.

What is claimed is:

1. A device for characterizing a microlithographic mask, comprising:
   an illumination optical unit for illuminating structures of a mask configured for use in a lithography process in a microlithographic projection exposure apparatus;
   a detector unit; and
   an evaluation unit for evaluating the data recorded by the detector unit;
   wherein the detector unit is configured for the spatially resolved determination of both the intensity and the polarization state of the respectively impinging light emanating from the mask, and the spatially resolved determination of both the intensity and the polarization state using the detector unit is effected in one single exposure step.

2. The device of claim 1, wherein the detector unit has a sensor arrangement composed of a plurality of intensity sensors and a polarizer arrangement composed of a plurality of polarizers, said polarizer arrangement being situated in the optical path upstream of the sensor arrangement, wherein polarizers of the polarizer arrangement are respectively assigned to different intensity sensors of the sensor arrangement.

3. The device of claim 2, wherein the sensor arrangement is configured as a periodic array of intensity sensors.

4. The device of claim 2, wherein the polarizer arrangement is configured as a periodic array of polarizers.

5. The device of claim 2, wherein the polarizer arrangement has polarizers having mutually different polarization transmission directions.

6. The device of claim 5, wherein polarization transmission directions of different polarizers differ from one another by an integer multiple of 22.5°, in particular by an integer multiple of 45°, or by an integer multiple of 30°, in particular by an integer multiple of 60°.

7. The device of claim 2, wherein the sensor arrangement also has intensity sensors on which, during the operation of the device, light impinges without previously passing through one of the polarizers of the polarizer arrangement.

8. The device of claim 2, wherein the polarizer arrangement is designed for an operating wavelength in a range from 13 nm to 250 nm, in particular for an operating wavelength in a range from 190 nm to 200 nm.

9. The device of claim 1, wherein the device is designed for emulating polarization-dependent effects in the form of a polarization dependence of the interference of electromagnetic radiation that takes place in a wafer plane during the operation of the microlithographic projection exposure apparatus, wherein the data used for emulating the polarization-dependent effects are recorded by the detector unit in a single exposure step.

10. The device of claim 1, further comprising an imaging optical unit for imaging the mask onto the detector unit.

11. The device of claim 1, wherein the evaluation unit is configured to reconstruct an image of the mask with the application of an iterative Fourier retrieval algorithm.

12. A device for characterizing an object, comprising:
    an illumination optical unit for illuminating the object with light having an operating wavelength in a range from 13 nm to 250 nm;
    a detector unit; and
    an evaluation unit for evaluating the data recorded by the detector unit;
    wherein the detector unit is configured for the spatially resolved determination of both the intensity and the polarization state of the respectively impinging light emanating from the object, and the spatially resolved determination of both the intensity and the polarization state using the detector unit is effected in one single exposure step.

13. The device of claim 12, wherein the detector unit comprises a sensor arrangement composed of a plurality of intensity sensors and a polarizer arrangement composed of a plurality of polarizers, said polarizer arrangement being situated in the optical path upstream of the sensor arrangement, wherein polarizers of the polarizer arrangement are respectively assigned to different intensity sensors of the sensor arrangement.

14. A method for characterizing a microlithographic mask,
    wherein structures of a mask intended for use in a lithography process in a microlithographic projection exposure apparatus are illuminated by an illumination optical unit; and
    wherein a spatially resolved determination of both the intensity and the polarization state of the respectively impinging light emanating from the mask is carried out by at least one detector unit, and the spatially resolved determination of both the intensity and the polarization state is performed by the at least one detector unit in one single exposure step.

15. The method of claim 14, wherein the detector unit has a sensor arrangement composed of a plurality of intensity sensors and a polarizer arrangement composed of a plurality of polarizers, said polarizer arrangement being situated in the optical path upstream of the sensor arrangement, wherein polarizers of the polarizer arrangement are respectively assigned to different intensity sensors of the sensor arrangement.

16. The method of claim 15, wherein the respective extinction factor of the polarizers is taken into account during the evaluation of the data recorded by the detector unit.

17. The method of claim 14, wherein for a respective polarized illumination setting which is set in the illumination optical unit and which, both in terms of the intensity distribution and in terms of the polarization distribution, at least approximately corresponds to the illumination setting predefined in the microlithographic projection exposure apparatus, the data used for emulating the polarization-dependent effects are recorded by the detector unit in a single exposure step.

18. The method of claim 14, wherein data recorded by the detector unit are evaluated in an evaluation unit, wherein polarization-dependent effects in the form of a polarization dependence of the interference of electromagnetic radiation that takes place in a wafer plane during the operation of the microlithographic projection exposure apparatus are emulated during this evaluation.

19. The method of claim 14, wherein the mask is imaged onto the at least one detector unit by an imaging optical unit.

20. The method of claim 14, wherein an image of the mask is reconstructed with the application of an iterative Fourier retrieval algorithm.

* * * * *